United States Patent
Chambers et al.

(10) Patent No.: US 9,218,240 B2
(45) Date of Patent: Dec. 22, 2015

(54) ERROR DETECTION AND ISOLATION

(71) Applicant: INTERNATIONAL BUSINESS MACHINES CORPORATION, Armonk, NY (US)

(72) Inventors: Scott L. Chambers, Rochester, MN (US); An Ding Chen, Shanghai (CN); Doyle J. McCoy, Rochester, MN (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 89 days.

(21) Appl. No.: 14/038,308

(22) Filed: Sep. 26, 2013

(65) Prior Publication Data

US 2015/0089332 A1    Mar. 26, 2015

(51) Int. Cl.
*H03M 13/00* (2006.01)
*G06F 11/10* (2006.01)
*H04L 1/08* (2006.01)
*H03M 13/09* (2006.01)
*H03M 13/15* (2006.01)
*H03M 13/19* (2006.01)
*H03M 13/29* (2006.01)

(52) U.S. Cl.
CPC ........... *G06F 11/10* (2013.01); *H03M 13/6306* (2013.01); *H04L 1/08* (2013.01); *H03M 13/09* (2013.01); *H03M 13/152* (2013.01); *H03M 13/1515* (2013.01); *H03M 13/19* (2013.01); *H03M 13/2957* (2013.01)

(58) Field of Classification Search
CPC ...... H03M 13/13; G06F 11/10; G06F 11/073; G06F 11/1004; G06F 11/167; G06F 11/076; G06F 11/2007; G06F 13/4286; G06F 13/385; G06F 13/387; G06F 13/4221; G06F 11/3089; G06F 13/4072; G11C 29/022; G11C 5/04; G11C 29/02
See application file for complete search history.

(56) References Cited

U.S. PATENT DOCUMENTS

| | | | | |
|---|---|---|---|---|
| 4,356,546 | A | * | 10/1982 | Whiteside et al. ............... 714/10 |
| 5,751,773 | A | * | 5/1998 | Campana, Jr. ................ 375/346 |
| 5,912,906 | A | | 6/1999 | Wu et al. |

(Continued)

FOREIGN PATENT DOCUMENTS

JP          H0696030 A          4/1994

OTHER PUBLICATIONS

Q. Yu, "Dual-Layer Adaptive Error Control for Network-on-Chip Links", Jul. 2012, IEEE, pp. 1304-1317.

(Continued)

*Primary Examiner* — Guerrier Merant
(74) *Attorney, Agent, or Firm* — Michael Le Strange; Andrew M. Calderon; Roberts Mlotkowski Safran & Cole, P.C.

(57) ABSTRACT

An approach to determine whether errors associated with transmitted data are associated with a transmitting device, a receiving device, and/or a connecting device that connects the transmitting device to the receiving device. The approach includes a method that includes receiving transmitted data with a buffer. The approach further includes analyzing the transmitted data which includes an error correcting process to detect errors and determine that the transmitted data has an error that requires additional analysis. The approach further includes determining that the error is associated with a receiving device, the transmitting device, or a connecting device that connects the receiving device and the transmitting device.

19 Claims, 6 Drawing Sheets

(56) References Cited

U.S. PATENT DOCUMENTS

| | | | |
|---|---|---|---|
| 5,940,769 A * | 8/1999 | Nakajima et al. | 455/509 |
| 6,157,967 A * | 12/2000 | Horst et al. | 710/19 |
| 6,546,507 B1 * | 4/2003 | Coyle et al. | 714/43 |
| 6,802,039 B1 | 10/2004 | Quach et al. | |
| 7,120,846 B2 * | 10/2006 | Kawagishi et al. | 714/748 |
| 7,272,773 B2 | 9/2007 | Cargnoni et al. | |
| 8,498,204 B2 * | 7/2013 | Toyoda et al. | 370/226 |
| 2004/0039504 A1 * | 2/2004 | Coffee et al. | 701/35 |
| 2005/0246417 A1 * | 11/2005 | Raith et al. | 709/203 |
| 2007/0019566 A1 * | 1/2007 | Sawada et al. | 370/252 |
| 2008/0022193 A1 * | 1/2008 | Maciver et al. | 714/800 |
| 2009/0187807 A1 * | 7/2009 | Narasimha et al. | 714/761 |
| 2009/0204852 A1 * | 8/2009 | Diggs et al. | 714/42 |
| 2010/0240317 A1 * | 9/2010 | Giles et al. | 455/67.13 |
| 2011/0026423 A1 * | 2/2011 | Quigley et al. | 370/252 |
| 2011/0185262 A1 * | 7/2011 | Kershaw et al. | 714/776 |
| 2011/0191648 A1 | 8/2011 | Suzuki | |
| 2013/0061087 A1 | 3/2013 | Kopylovitz | |
| 2013/0283108 A1 * | 10/2013 | Kono et al. | 714/712 |

OTHER PUBLICATIONS

S. J. Simske, "Error-Correcting Code (ECC) and Module Size Considerations in 2D Aztec Barcode Readability", Nov. 2010, SPIE—The International Society for Optical Engineering, Abstract only.

Unknown Author, "Forward Error Correction", Wikipedia, downloaded Sep. 26, 2013, previously archived on Mar. 4, 2013, 8 pages.

Unknown Author, "Noisy-channel coding theorem", Wikipedia, downloaded Sep. 26, 2013, previously archived on Mar. 4, 2013, 6 pages.

Unknown Author, "Turbo Code", Wikipedia, downloaded Sep. 26, 2013, previously archived on Mar. 4, 2013, 6 pages.

Unknown Author, "Error detection and correction", Wikipedia, downloaded Sep. 26, 2013, previously archived on Mar. 4, 2013, 9 pages.

Unknown Author, "Reed—Solomon error correction", Wikipedia, downloaded Sep. 26, 2013, previously archived on Mar. 4, 2013, 12 pages.

Unknown Author, "Shannon—Hartley theorem", Wikipedia, downloaded Sep. 26, 2013, previously archived on Mar. 4, 2013, 7 pages.

Unknown Author, "Buffer credits", Wikipedia, downloaded Sep. 26, 2013, previously archived on Mar. 4, 2013, 1 page.

* cited by examiner

ERROR DETECTION AND ISOLATION

FIELD OF THE INVENTION

The present invention generally relates to error analysis and correction, and more particularly, to methods and systems for determining whether errors associated with transmitted data are associated with a transmitting device, a receiving device, and/or a connecting device that connects the transmitting device to the receiving device.

BACKGROUND

Computing devices often rely on the accuracy of data being transmitted between different components within the computing device. One device, known as a transmitting (Tx) device, may transmit data to another device known as a receiving (Rx) device. The Tx device and the Rx device may reside on a single device (e.g., a backplane, a motherboard, a circuit board, etc.) or the Tx device and the Rx device may reside on multiple devices. The Tx device and the Rx device may send data to each other via a connecting device, such as serial or parallel bus.

To ensure that the transmitted data has no errors or has a quantity of errors less than a threshold, the Tx device may use a technique known as error correcting code (ECC) to determine whether the transmitted data includes any errors and also to correct the errors. One type of ECC technique is forward error correction (FEC). In ECC, the Tx device may, for example, add an amount of code (containing one or more bits) to the data prior to transmission. The Rx device may receive the transmitted data and may use a checksum technique to determine whether the added bits of information to the transmitted data are received in the same quantity and/or location as when transmitted by the Tx device. If the Rx device determines that one or more of the bits are not transmitted in the same order, or in the same quantity, as the bits encoded by the Tx device, the Rx device may determine that there is an error associated with the transmitted data. The Rx device, using ECC, may also correct the error.

In the event that two errors occur in the transmitted data, the ECC system may determine that the transmitted data is invalid which may result in the ECC system in failing the Tx device without any further analysis as to whether the Rx device or the connecting device are causing the error. If, on the other hand, the Rx device determines that the one or more bits are transmitted in the same order and/or in the same quantity as the bits encoded by the Tx device, the Rx device may determine that there is no error associated with the transmitted data.

SUMMARY

In one aspect of the invention, a method may include receiving transmitted data within a buffer, with the transmitted data including an identifier for a transmitting device. The method further includes analyzing the transmitted data which includes using an error correcting process to detect errors. The method further includes determining that the transmitted data has an error that requires additional analysis; and determining that the error is associated with a receiving device, a transmitting device, or a connecting device that connects the receiving device and the transmitting device.

In another aspect of the invention, a system includes a CPU, a computer readable storage memory and a computer readable storage media. Additionally, the system includes program instructions to analyze transmitted data received from a device. The system also includes program instructions to determine when an error exists in the transmitted data, and program instructions to analyze the error to determine which device caused the error, or requesting retransmission of the transmitted data when the error is found. Each of the program instructions are stored on the computer readable storage media for execution by the CPU via the computer readable memory.

In yet another aspect of the invention, a computer program product including a computer usable storage medium having readable program code embodied in the medium is provided. The computer program product includes at least one component operable to receive transmitted data within a buffer from a transmitting device, the transmitted data including an identifier for a transmitting device, control code that identifies a bus lane of a connecting device being used to send the transmitted data, and a quantity of bits. The computer program product includes analyzing the transmitted data for errors to determine whether the quantity of bits in the transmitted data is the same as the quantity of bits in the transmitted data that is received. The computer program product includes determining that the transmitted data has an error based on the quantity of bits in the transmitted data being different than the quantity of bits in the received transmitted data and determining whether the error can be corrected, based on the type of error in the transmitted data. The computer program product includes correcting the error based on determining that the type of error can be corrected so that the transmitted data can be used by a processor. The computer program product includes sending a buffer credit, based on correcting the error, to the transmitting device to transmit additional data, the buffer credit being a notification to the transmitting device that the transmitted data is received and to transmit the additional data. The computer program product also includes receiving the additional data from the transmitting device, the additional data being transmitted through a different bus lane of the connecting device than the bus lane used to transmit the transmitted data.

BRIEF DESCRIPTION OF THE SEVERAL VIEWS OF THE DRAWINGS

The present invention is described in the detailed description which follows, in reference to the noted plurality of drawings by way of non-limiting examples of example embodiments of the present invention.

DETAILED DESCRIPTION

Figure 1:
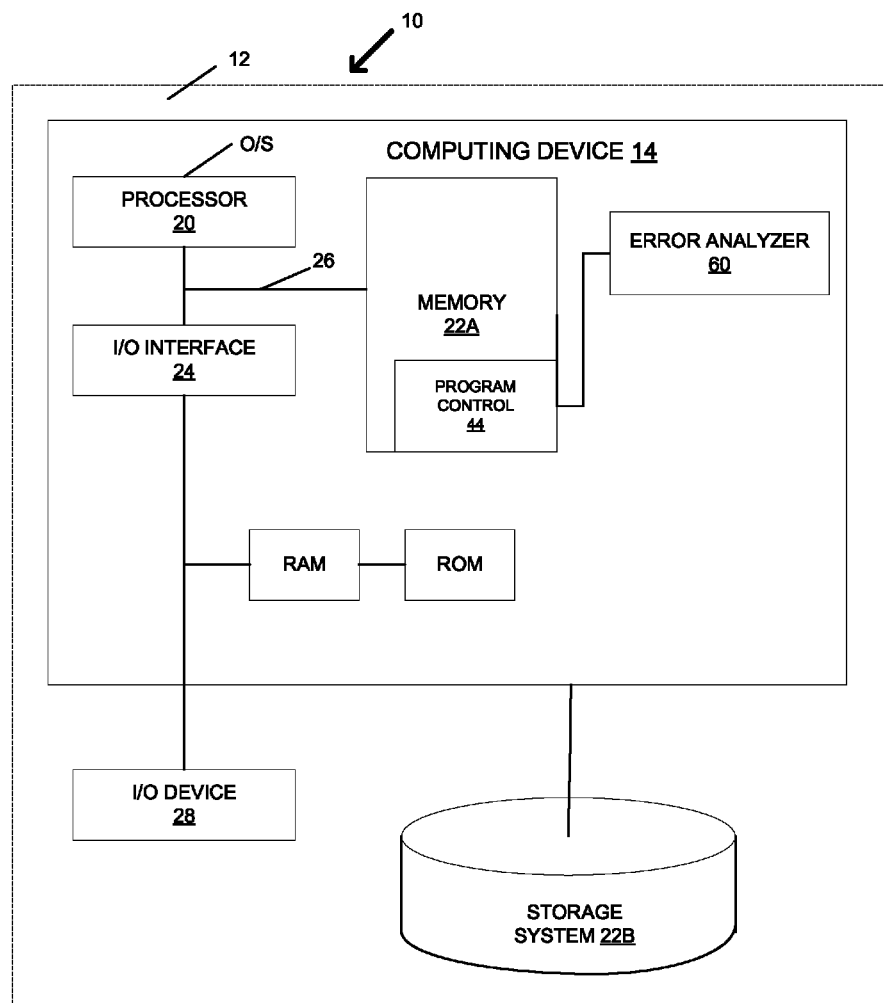
FIG. 1 shows an illustrative environment for implementing the steps in accordance with aspects of the invention.

The present invention generally relates to error analysis and correction, and more particularly, to methods and systems for determining whether errors associated with transmitted data are associated with a transmitting device, a receiving device, and/or a connecting device that connects the transmitting device to the receiving device. As a result of implementing the processes and systems of the present invention, the particular device that is causing the error may be determined. Advantageously, this will prevent the user from spending unneeded time and money to find the error and to avoid mistakenly replacing devices that are not the cause of the error.

In more specific aspects of the invention, the present invention permits for transmitted information to be sent within a buffer, with the buffer being transmitted from a Tx device to an Rx device. The buffer may include one or more data packets that have a particular quantity of data (e.g., 32 bits, 645 bits, 128 bits, 4 KB, 16 KB, 64 KB, etc.). In embodiments, the data can be associated with a logical page and used within large scale copper serial attached SCSI (SAS) fabric environments. With particular sizes, the error correction could be packetized within a larger data set to simplify an error correcting algorithm. If the Rx device determines that there is no error, a buffer credit may be sent to the Tx device which notifies the Tx device that the buffer was received and to send the next buffer that includes additional data for transmission from the Tx device to the Rx device. If the Rx device determines that there is an error, the Rx device may determine the cause of the error and/or the Rx device may request the Tx device to resend the buffer.

In embodiments, the Tx device and/or the Rx device may be associated with one or more input/output (I/O) devices, hard drives, memory devices, Ethernet cards, video cards, audio cards, Infiniband®, fiberchannel optic devices, SAS, and/or any other type of device. The Tx device and the Rx device may be connected to each other by using different types of connecting devices, such as Peripheral Component Interconnect Express (PCIe), optical fiber, cable, wiring, serial ATA (SATA), serial peripheral interface bus (SPI bus), 1-Wire, and/or any other type of device that permits the Tx device to communicate with the Rx device. The communications between the Tx device and the Rx device may be wired, wireless, or a combination of wired and wireless communication systems.

In embodiments, the Tx device and/or the Rx device may determine that the error is associated with the Tx device and/or the Rx device. For example, the error may be associated with failure or a near-failure of the Tx device and/or the Rx device. Additionally, or alternatively, the error may be associated with noise that has been added to the data by the Tx device, the Rx device, and/or the connecting device. Additionally, or alternatively, for example, the error may be associated with a fabric error, bus freeze, broken pin, and/or any other type of error associated with the connecting device. Additionally, or alternatively, the Tx device and/or the Rx device may determine that the error is due to power level inputs, and/or the temperature and humidity levels associated with the environment within which the Tx device and the Rx device are being operated. Additionally, or alternatively, the Tx device and/or the Rx device may determine that when the temperature and humidity levels increase the error rate beyond a threshold, this may require replacing the Tx device and/or the Rx device.

Advantageously, the error may be determined by the use of an error analyzer (stored by the Tx device and/or the Rx device) operable and/or configurable to obtain transmitted data and determine whether an error exists. The error analyzer permits for a more accurate determination as to which device (e.g., Tx device, Rx device, connecting device, etc.) is the cause of the error.

In embodiments, the Tx device and the Rx device may be a part of the same computing apparatus. For example, the Tx device could be associated with one card (e.g., a video card) and the Rx device could be associated with a second card (e.g., an audio card), with both cards communicating with each other. In embodiments, the Tx device and the Rx device may each be a part of a different computing apparatus. For example, the Tx device could be stored by a server and the Rx device could be stored by another computing apparatus (e.g., external hard drive).

System Environment

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1 shows an illustrative environment 10 for managing the processes in accordance with the invention. To this extent, the environment 10 includes a server or other computing system 12 that can perform the processes described herein. In particular, computing system 12 includes a computing device 14. The computing device 14 can be resident on a network infrastructure or computing device of a third party service provider (any of which is generally represented in FIG. 1).

The computing device 14 also includes a processor 20, memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with external I/O device/resource 28 and storage system 22B. For example, I/O device 28 can comprise any device that enables an individual to interact with computing device 14 (e.g., user interface) or any device that enables computing device 14 to communicate with one or more other computing devices using any type of communications link. External I/O device/resource 28 may be for example, a handheld device, PDA, handset, keyboard etc.

In general, processor 20 executes computer program code (e.g., program control 44), which can be stored in memory 22A and/or storage system 22B. Processor 20 may analyze information associated with errors. Moreover, in accordance with aspects of the invention, program control 44 controls an error analyzer 60, e.g., the processes described herein. Error analyzer 60 can be implemented as one or more program code in program control 44 stored in memory 22A as separate or combined modules. Additionally, error analyzer 60 may be implemented as separate dedicated processors or a single or several processors to provide the function of these tools. While executing the computer program code, processor 20 can read and/or write data to/from memory 22A, storage system 22B, and/or I/O interface 24. The program code executes the processes of the invention. The bus 26 provides a communications link between each of the components in computing device 14.

In embodiments, error analyzer 60 is configured to receive data and to encode the information with control code and/or error correcting code. By way of example, error analyzer 60 may be stored by a Tx device that transmits data to an Rx device. Before transmitting the data, error analyzer 60 may encode the data with control code and/or error correcting code. The control code may indicate whether the transmitted data is free or is in use; whether the data is ready or not ready; and/or whether the data is for transmit or that the data is for receive. The error correcting code may be one or more bits of information added to the transmitted data that is then checked by the Rx device to determine that the transmitted code has been transmitted with no errors or with errors that are less than a threshold quantity of allowed errors. Error analyzer 60 may use an algorithm, such as forward error correction, Reed-Solomon code, etc., to add the code.

The transmitted data may be sent as a buffer from the Tx device to the Rx device. The buffer may be associated with a particular bus lane of the connecting device and may be given an identifier (e.g., buffer 1 for a buffer associated with lane 1 of the connecting device). In embodiments, the buffer may be mapped one-to-one to a buffer configuration on the receive side, or may also use a mapping array to associate a transmit buffer to a receive buffer credit number. The Rx device may receive the transmitted data in the buffer and determine, based on the location and quantity of error bits within the buffer, whether there is an error associated with the information. The Rx device may calculate a checksum to verify the error correcting code of the data. The Rx device may also increment a bit-error count by the number of error bits.

In embodiments, error analyzer 60 is configured to receive encoded data from the Tx device and decode the data and to also analyze the control and the error correcting code. By way of example, error analyzer 60 may receive data, within a buffer, from a Tx device and error analyzer 60 may calculate a checksum, verify ECC of the transmitted data, and make any corrections to the transmitted data if any correctable errors are detected. If error analyzer 60 detects a correctable or uncorrectable error, error analyzer 60 can increment a bit error count by the number of bits associated with the error. A data total count is also incremented, by error analyzer 60, by the number of bytes received. Error analyzer 60 may calculate the bit error rate by dividing the bit error count by the data total count. Error analyzer 60 may then determine whether there are any errors associated with the data. Error analyzer 60 may use statistical information to determine the type of errors and also determine whether the errors exceed a threshold.

In embodiments, error analyzer 60 may be associated with a graphical user interface (GUI) that permits a user to select different options to configure error analyzer 60 to analyze transmitted data. This permits error analyzer 60 to be customized to detect and/or correct different levels of errors for different types of devices. For example, error analyzer 60 may be configured to only check for errors that exceed a particular threshold for different types of devices (e.g., a Tx device, an Rx device, a connecting device, etc.). Additionally, or alternatively, error analyzer 60 may be configured to request data be re-transmitted if the errors exceed one threshold and to correct errors if the errors exceed a second threshold. A threshold may be associated with a particular number of errors (e.g., one error, two errors, etc.) found in the transmitted data, the data size of the error (e.g., 0.1 kB size of the error), a particular number of errors during a time period (e.g., one hour), and/or any other type of threshold. Additionally, or alternatively, error analyzer 60 may be configured to determine errors over a period of time. Additionally, or alternatively, error analyzer 60 may be configured to determine errors based on temperature and humidity levels associated with computing device 14.

The computing device 14 can comprise any general purpose computing article of manufacture capable of executing computer program code installed thereon (e.g., a personal computer, a server, etc.). However, it is understood that computing device 14 is only representative of various possible equivalent-computing devices that may perform the processes described herein. To this extent, in embodiments, the functionality provided by computing device 14 can be implemented by a computing article of manufacture that includes any combination of general and/or specific purpose hardware and/or computer program code. In each embodiment, the program code and hardware can be created using standard programming and engineering techniques, respectively. In embodiments, computing device 14 may be part of a device, such as I/O device, a memory card, a video card, a hard drive, and/or any other type of device that may be part of a computing device used as a Tx device and/or a Rx device.

Similarly, computing system 12 is only illustrative of various types of computer infrastructures for implementing the invention. For example, in embodiments, computing system 12 comprises two or more computing devices (e.g., a server cluster) that communicate over any type of communications link, such as a network, a shared memory, or the like, to perform the process described herein. Further, while performing the processes described herein, one or more computing devices on computing system 12 can communicate with one or more other computing devices external to computing system 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

Figure 2:
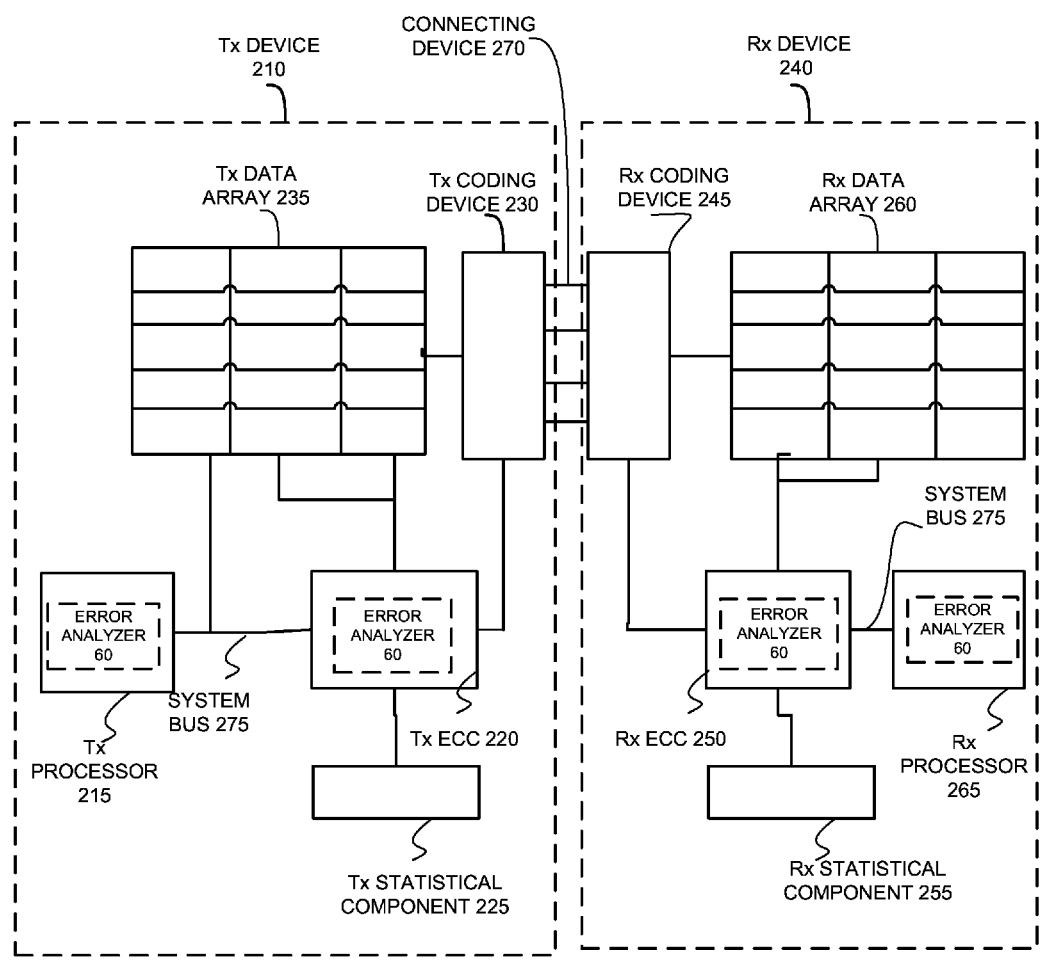
FIG. 2 shows a block diagram of a computing system in accordance with aspects of the invention.

FIG. 2 shows a block diagram of a computing system implementing processes in accordance with aspects of the present invention. Specifically, FIG. 2 shows a Tx device 210 and a Rx device 240, and a connecting device 270, connecting Tx device 210 and Rx device 240, any of which can be representative of the computing device of FIG. 1. In FIG. 2, Tx Device 210 comprises the following components: Tx processor 215, Tx error correcting controller (ECC) 220, a Tx statistical component 225, a Tx coding device 230, and a Tx data array 235. In FIG. 2, Rx device 240 comprises the following components: an Rx coding device 245, an Rx error correcting controller (ECC) 250, an Rx statistical component 255, an Rx data array 260, and an Rx processor 265 any of which can be include error analyzer 60.

Tx Device 210

Tx device 210 may include any computing device that is capable of transmitting and/or storing information. For example, Tx device 210 may be a hard drive, an optical disk drive, a memory card, a communication card, an ASIC, an I/O raid adapter, an I/O card, a video card, etc. In embodiments, Tx device 210 may transmit data to another device, such as Rx device 240.

Tx Processor 215

Tx processor 215 may include any computing device that is capable of performing higher level functions. For example, Tx processor 215 may be used by Tx device 210 to perform higher level functions (e.g., determining whether Tx device 210 is the source of the error) when receiving a trap from Tx ECC 220 and/or Rx ECC 250. The trap may be sent when Rx ECC 250 determines that transmitted data has errors that exceed a threshold (e.g., a total number of errors). In embodiments, Tx processor 215 can be representative of processor 20 of FIG. 1. In embodiments, error analyzer 60 may be resident on or in Tx processor 215.

Tx ECC 220

Tx ECC 220 may include any computing device that is capable of calculating error correcting code (ECC) checksums, assigning data ECC array elements to a particular buffer, setting option bits, and multiplexing data reassembly, and performing ECC control decisions for isolating problems that are causing errors in transmitted data. In embodiments, error analyzer 60 may be resident on or in Tx ECC 220.

Tx Statistical Component 225

Tx statistical component 225 may include any computing device that is capable of storing and/or transmitting data associated with statistical analysis logic, bit error rates, data clocking rates, and data quantity rates. The statistical analysis logic may include using different statistical methods such as analysis of standard deviation analysis, tree-analysis, binomial analysis, regression analysis, and/or any other type of statistical analysis.

In embodiments, Tx statistical component 225 may use the statistical analysis logic to determine that an error beyond a threshold (e.g., greater than a half standard deviation, one standard deviation, two standard deviations, etc.) is associated with a mechanical failure. The mechanical failure may, for example, be a broken part of the Rx device, such as a broken pin, or an incorrectly connected component. In embodiments, Tx statistical component 225 may be a part of Tx ECC 220 or may be a separate device from Tx ECC 220.

Tx Coding Device 230

Tx coding device 230 may include any computing device that is capable of providing multiplexing and bus control. In embodiments, Tx coding device 230 may include serial data lanes that transmit a data block to any equivalent data ECC array associated with an Rx device. In embodiments, Tx coding device 230 may include compression/decompression capabilities that permit Tx coding device 230 to compress the data bit quantity to a lower data bit amount that allows for transmission of the data. Tx coding device 230 may also include idle cycle functions when data is not being transmitted or being received.

Tx Data Array 235

Tx data array 235 may include any computing device that is capable of storing and/or transmitting information associated with storing an array of buffers for transmitting information. For example, Tx data array 235 may be a buffer that includes and/or stores a data block defined by an ECC algorithm, ECC data associated with the data block, and control data for the buffer. In embodiments, each entry within the data array may be associated with a particular part of Tx device 210 and may also be associated with a particular bus lane of connecting device 270.

Rx Device 240

Rx device 240 may include any computing device that is capable of receiving information. For example, Rx device 240 may be hard drive, optical disk drive, memory card, communication card, etc. In embodiments, Rx device 240 may receive data from another device, such as Tx device 210.

Rx Coding Device 245

Rx coding device 245 may include any computing device that is capable of providing multiplexing and bus control. In embodiments, Rx coding device 245 may include serial data lanes that transmit a data block to any equivalent data ECC array associated with an Rx device. In embodiments, Rx coding device 245 may include compression/decompression capabilities that permit Rx coding device 245 to compress the data bit quantity to a lower data bit amount of transmission. Rx coding device 245 may also include idle cycle functions that idle Rx coding device 245 when data is not being transmitted or being received.

Rx ECC 250

Rx ECC 250 may include any computing device that is capable of calculating ECC checksums, assigning data ECC array elements to a particular buffer, setting option bits, and multiplexing data reassembly, and performing ECC control decisions for isolating problems that are causing errors in transmitted data. Rx ECC 250 may receive transmitted data from Tx device 210 via Rx coding device 245. In embodiments, Rx ECC 250 may analyze the transmitted data and determine whether the transmitted data has errors. When errors exists, or errors exceed a threshold quantity of errors, Rx ECC 250 may correct the errors, request Tx device 210 to resend the data, and/or send the data to Tx processor 215 and Rx processor 265 for further analysis as to which device is the cause of the error. When no error exists, or errors are less than a threshold quantity of errors, Rx ECC 250 may send a buffer credit to Tx device 210 that indicates that the transmitted data was received and that additional data can be transmitted. In embodiments, error analyzer 60 may be resident on or in Rx ECC 250.

Rx Statistical Component 255

Rx statistical component 255 may include any computing device that is capable of storing and/or transmitting data associated with statistical analysis logic, bit error rates, data clocking rates, and data quantity rates. The statistical analysis logic may include using different statistical methods such as analysis of standard deviation analysis, tree-analysis, binomial analysis, regression analysis, and/or any other type of statistical analysis. Rx statistical component 255 may use the statistical analysis logic to determine that an error beyond a threshold (e.g., greater than a half standard deviation, one standard deviation, two standard deviations, etc.) is associated with a mechanical failure. The mechanical failure may, for example, be a broken part of the Rx device, such as a broken pin, or an incorrectly connected component. In embodiments, Rx statistical component 250 may be a part of Rx ECC 240. In other embodiments, Rx statistical component 250 may be a separate device than the Rx ECC 240.

Rx Data Array 260

Rx data array 260 may include any computing device that is capable of storing and/or transmitting data associated with storing an array of buffers for transmitting data. For example, Rx data array 260 may store a buffer that includes a data block defined by an ECC algorithm, ECC data associated with the data block, and control data for the buffer. In embodiments, each entry within the data array may be associated with a particular part of Rx device 240 that is to receive the transmitted data. Each entry within the data array may also be associated with a particular bus lane of connecting device 270.

Rx Processor 265

Rx processor 265 may include any computing device that is capable of performing higher level functions. For example, Rx processor 265 may be used by Rx device 240 to perform higher level functions when receiving a trap from Rx ECC 250. Examples of higher level include functions such as analyzing temperature and humidity levels of Rx device 240; comparing the number of errors occurring with a threshold number of errors occurring within a particular time period; and/or other types of error analysis. Rx processor 265 may analyze an error associated with the transmitted data to determine the source of the error. In embodiments, Rx processor 265 may be representative of processor 20 of FIG. 1. In embodiments, error analyzer 60 may be resident on or in Rx processor 265.

Additional Components

Connecting device 270 may include any device that is capable of transferring data between Tx device 210 and Rx device 240. For example connecting device 270 may include Peripheral Component Interconnect Express (PCIe), optical fiber, cable, wiring, serial ATA (SATA), serial peripheral interface bus (SPI bus), 1-Wire, universal serial bus (USB), STEbus, PCI-104, and/or any other type of device that permits Tx device 210 to transmit/receive data to/from Rx device 240. Connecting device 270 may also be associated with one or more lane busses which connect Tx device 210 and Rx device 240 by either utilizing serial or parallel data clocking techniques. The lane busses may be full duplex (i.e., bidirectional) or half-duplex (i.e., negotiated direction) channels. In embodiments, the lane busses cross at least one or more physical card interconnect points across two or more circuit boards e.g., the lane busses may connect one chip to another chip when both chips are located on the same circuit board.

System bus 275 may include any device capable of connecting Tx ECC 220 to Tx processor 215 and Rx ECC 250 to Rx processor 265. For example, system bus 275 may include a control bus, address bus, a data bus, and/or any other type of bus. In embodiments, system bus 275 may be connected to compression and/or expansion hardware.

Example Operations

In embodiments, error analyzer 60 may be stored by Tx device 210 and/or Tx processor 215. In this implementation, error analyzer 60 may add error correcting code and control code to data in buffers that are to be sent to Rx device 240. In this way, when the transmitted data is sent to Rx device 240, the error correcting code can be used by Rx device 240 to determine if the received error correcting code is the same as the transmitted error correcting code. Further, the Rx device 240 may use the control code to determine the type of transmitted data and from which bus lane the transmitted data is sent.

In embodiments, error analyzer 60 may be stored by Rx device 240 and/or Rx processor 265. In this implementation, error analyzer 60 may receive data, within a buffer, from a Tx device and error analyzer 60 may calculate a checksum, verify ECC of the transmitted data, and make any corrections to the transmitted data if any correctable errors are detected. If error analyzer 60 detects a correctable or uncorrectable error, error analyzer 60 increments a bit error count by the number of bits associated with the error. A data total count is also incremented, by error analyzer 60, by the number of bytes received. Error analyzer 60 may calculate the bit error rate by dividing the bit error count by the data total count. Error analyzer 60 may then determine whether there are any errors associated with the data. Error analyzer 60 may use statistical information to determine the type of errors and also determine whether the errors exceed a threshold.

If error analyzer 60 determines that there is no error in the transmitted data, the Rx device may send a buffer credit to the Tx device. The buffer credit may indicate, to the Tx device, that the transmitted data does not have any errors and that additional data can be transmitted from the Tx device to the Rx device. The Tx device may transmit another buffer with additional data to the Rx device. The Rx device may also send a message to a graphical user interface (GUI) associated with a system management application (e.g., Syslog, SNMP log, O/S words, events log, etc.) that provides management services for one or more devices such as the Tx device and/or the Rx device. A user of the system management application (being executed on a computing device) may view the message via the GUI. The message may inform a user of the system management application that there is no error associated with the Rx device.

If error analyzer 60 determines that there is an error and that the error is a correctable error, then error analyzer 60 may correct the error. However, if error analyzer 60 determines that there is an uncorrectable error associated with the transmitted data, then the Rx device may send a trap to a processor (Rx processor) associated with the Rx device and also send the trap to a processor (Tx processor) associated with the Tx device. Alternatively, if error analyzer 60 determines that the error is correctable, but that a particular statistic associated with the transmitted information has exceeded a threshold (e.g., a quantity of data in the buffer), then a trap is sent to processor 20 so that additional analysis may be performed to determine the source of the problem. The trap may include information about the transmitted data. The trap may include the particular lane number, within a bus, being used to transmit the data; the data ECC array entry number and data; the error type (e.g., correctable, uncorrectable, etc.); and the bit error counts and data total counts for all lanes. Additionally, or alternatively, the Rx device may send a request to the Tx device to resend the transmitted data.

When the Rx processor receives the trap, the Rx processor may perform further analysis to determine the cause of the error. For example, the Rx processor may analyze the trap and determine that the error is associated with a sudden event (e.g., a power fault) or may determine that the error is associated with increased humidity and/or temperature levels that are affecting the Rx device. The Rx processor may send a message to the GUI associated with the system management application that the Rx device is causing an error. The system management application may inform the user, based on the type of error and/or the quantity of error, to either keep the Rx device or replace the entire Rx device.

When the Tx processor receives the trap from the Rx device, the Tx processor may determine whether the error, associated with the particular bus lane and buffer, is being caused by the Tx device. By way of a non-limiting example, the Tx processor can track "on-time" statistics against previous "on-time" statistics. A change can be tracked against other statistical information to determine, for instance, during boot time whether a card or cable plug removal and re-insertion or replacement resulted in unsuitable communications on the network. There could also be exercising of the channel during boot time diagnostics (e.g., running pattern transmit receive tests with ECC analysis).

If the Tx processor determines that the Tx device is not causing the error, the Tx processor may send a message to the GUI associated with the system management application. The system management application may be executed by a computing device that is associated with the Tx device and/or the Rx device. The message may inform the user of the system management application that the Tx device is not the cause of the error and that the connecting device is causing the error. The user may then analyze the connecting device to determine the error. The analysis may be performed by the user physically inspecting the connecting device for a mechanical failure (e.g., such as a bent or broken pin on the connecting device).

If, on the other hand, the Tx processor determines that the Tx device is causing the error, the Tx processor may send a message to the GUI associated with the system management application to inform the user that the Tx device is causing the error. The system management application may notify the user of the amount of error and whether the error is exceeding a threshold (e.g., such as particular number of errors during a time period).

Flow Diagrams

FIGS. 3-6 show example flows for performing aspects of the present invention. For example, the steps of FIGS. 3-6 may be implemented in the environment of FIG. 1 and/or in the block diagram of FIG. 2. The flowcharts and block diagrams in the FIGS. illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions. Furthermore, the invention can take the form of a computer program product accessible from the computer-readable storage medium providing program code for use by or in connection with a computer or any instruction execution system or the computer readable signal medium.

Figure 3:
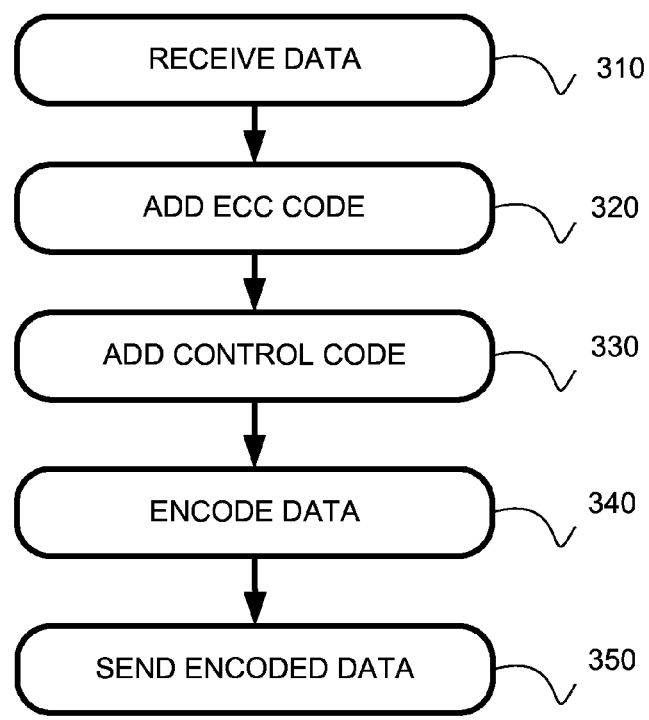
FIGS. 3-6 show example flow diagrams in accordance with aspects of the invention.

FIG. 3 depicts one example of a flow that processes in accordance with aspects of the invention. Specifically, FIG. 3 shows processes adding control and error correcting code to data and transmitting the data in accordance with aspects of the invention. The steps of FIG. 3 are described with regards to a Tx device encoding and sending data.

At step 310, a Tx data array within a Tx device receives data. The data may be any type of information that the Tx device sends to an Rx device. For example, the data may be generated by another component, such as a Tx processor, within the Tx device. Alternatively, for example, the data may be received from another device. In embodiments, the data may be stored within a Tx data array that stores multiple entries of data. Each entry of data may be associated with a particular sub-device, component and/or a part of the Tx device. In embodiments, each entry of data may be associated with a particular type of information (e.g., security information) within the data.

At step 320, error correcting code is added to the data. The Tx device may include an algorithm (e.g., associated with FEC, Reed-Solomon code, etc.) that allows for the Tx device to add the error correcting code to the data. The Tx ECC may also include logic that performs different tasks on the data, such as (i) calculating the ECC, (ii) assigning a number to the data, (iii) setting option bits in the control code, (iv) defining multiplexed data disassembly and reassembly by higher level functions on a system bus, (v) tracking statistical information, and/or (vi) initiating ECC control decisions for isolating problems causing an error. In embodiments, a Tx ECC, which is a part of the Tx device, may add the error correcting code or, in alternate embodiments, another component of the Tx device may add the error correcting code. The Tx ECC may add error correcting code to the data by using an logic stored by a Tx statistical component. The Tx statistical component may calculate and store bit error rates, data clocking rates, and the amount of data for each entry within the Tx data array that is associated with a particular bus lane.

At step 330, the Tx device adds control code to the data. The Tx device may include logic that allows for the Tx device to add the control code to the data. In embodiments, the control code may be used to define control elements to the data in the Tx data array or, alternatively, a Tx ECC, which is a part of the Tx device, may add the control code. In embodiments, another component of the Tx device may add the control code. In embodiments, the control code may include one content bit that may indicate that the data in the Tx data array is free or is in use. Additionally, or alternatively, the control code may include a control bit that indicates that the data is ready or is not ready for transmission. Additionally, or alternatively, the control code may include a control bit that indicates the data is for transmit or the data is for receive. Additionally, or alternatively, the control code may include a control bit that indicates the assignment of the data to a particular bus lane that will be used to transmit the data to an Rx device.

At step 340, the Tx device encodes the data so that the data can be sent from the Tx device to the Rx device. In embodiments, the encoded data may be compressed which permits a quantity of data to be below a threshold level of data size so that the connecting device can transmit the data to the Rx device. In embodiments, the Tx device may include a Tx coding device that encodes the data as well as providing multiplexing and bus control features.

At step 350, the Tx device sends the data to the Rx device via a connecting device. As described herein, the connecting device may be a PCIe, optical fiber, cable, wiring, SATA, SPI bus, 1-Wire, and/or any other type of connecting device. In embodiments, the data may be sent via a particular bus lane associated with the connecting device which may have an identifier that may include any alpha-numeric combination. In embodiments, the Tx device may send the data to the Rx device over a link layer. The link layer allows the transmitted data to be sent to the Rx device so that the transmitted data may be analyzed for errors.

Figure 4:
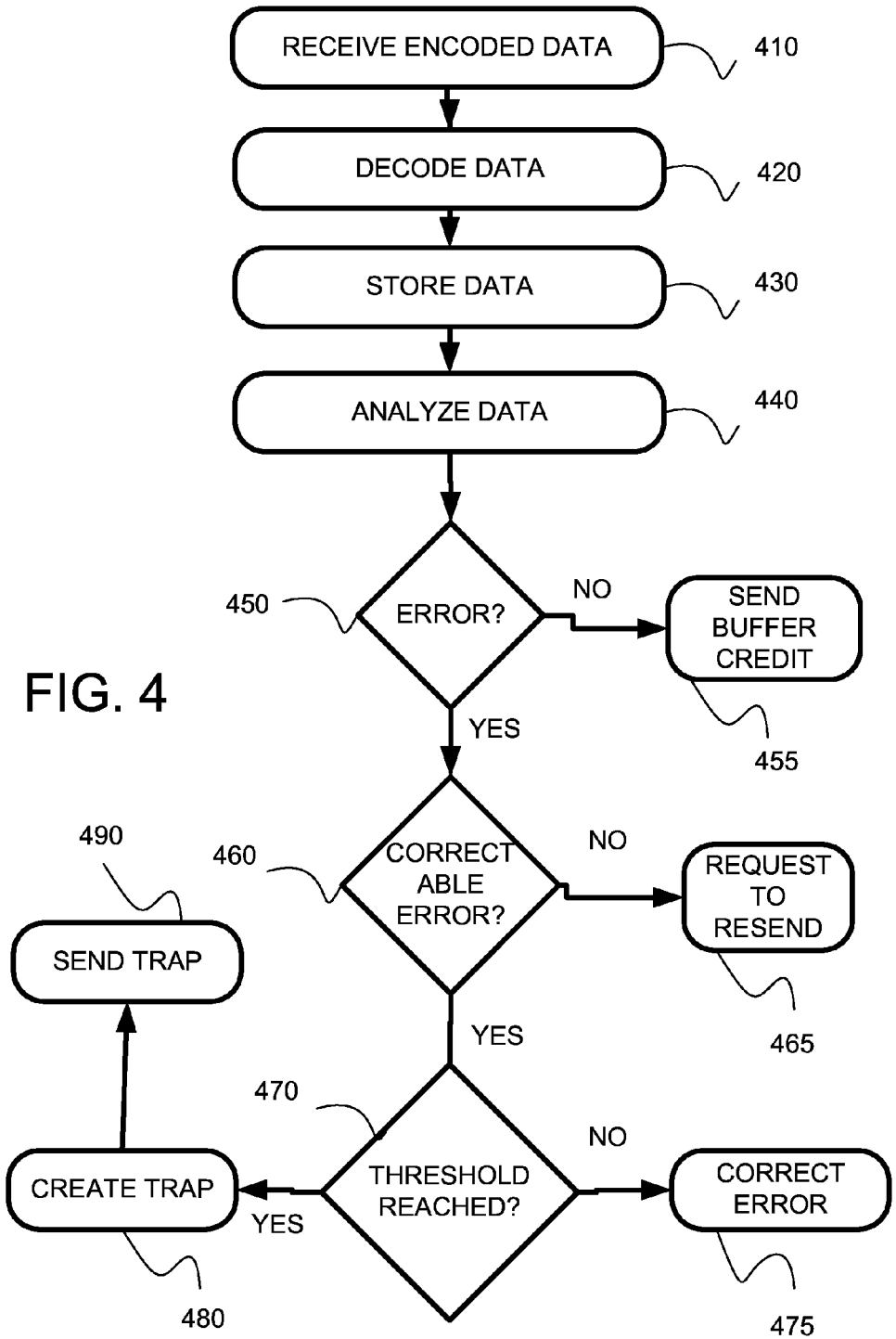

FIG. 4 depicts one example of a flow for analyzing transmitted data for errors in accordance with aspects of the invention. The steps of FIG. 4 are described with regards to any type of wireless and/or wired communications between devices. In the processes described in FIG. 4, the communication may be associated with an Rx device.

At step 410, an Rx device receives encoded data. The encoded data may be received from a Tx device via the connecting device. In embodiments, an Rx coding device, within the Rx device, may receive the encoded data as a buffer. At step 420, the encoded data may be decoded. In embodiments, an Rx coding device, within the Rx device, may decode the data.

At step 430, the Rx device stores the decoded data. In embodiments, the data may be stored within an Rx data array, within the Rx device, that stores multiple entries of data. Each entry within the Rx data array may be assigned a particular bus lane of a connecting device that connects the Rx device to the Tx device and each entry may be associated with a particular component of the Rx device.

At step 440, the Rx device may analyze the data to determine whether the data includes any errors. More specifically, the Rx device may analyze the error correcting code stored within the transmitted data to determine whether the error correcting code has no errors. For example, the Rx device may analyze the control code within the data to determine which bus lane the transmitted data is associated with, determine that the data is transmitted data from a particular Tx device, and/or determine other characteristics of the transmitted data. In embodiments, the Rx device may use an Rx ECC to determine whether the ECC information is correct.

By way of example, the Rx device may calculate a checksum to verify the error correcting code of the data. The Rx device may also increment a bit-error count by the number of error bits. In embodiments, the Rx ECC may use an Rx statistical component to analyze the error correcting code. The Rx statistical component may analyze bit error rates (e.g., 10%, 20%, 25%, etc.), data clocking rates (e.g., 10 kHz, 1 MHz, 1 GHz, etc.), and/or a quantity of data (e.g., 0.1 KB, 10 MB, 1 GB, etc.) associated with a particular bus lane that transmitted the data from the Tx device to the Rx device. For example, the Rx statistical component may analyze the quantity of data and compare the quantity of data to the Shannon limit (also known as the Shannon capacity) and a noise floor associated with the particular bus lane to determine whether the quantity of data is exceeding the maximum information transfer rate of the bus lane.

If there is no error in the transmitted data (step 450—No), then the Rx device may, at step 455, send a buffer credit to the Tx device. The buffer credit may include an identifier (e.g., a number which is used by the Tx device to determine which transmitted data within a buffer is associated with the buffer credit. Additionally, the Tx device may use the buffer credit to confirm that the transmitted data was sent with no errors or with an amount of error that is less than a threshold. The Tx device may then send additional data upon receiving the buffer credit.

If there is an error in the transmitted data (step 450—Yes), then the Rx device, at step 460, determines whether the error is a correctable error or an uncorrectable error. A correctable error may be associated with a bad cyclic redundancy check (CRC) check, an incorrectly nullified packet within the buffer, an incorrect packet sequence, and/or any other type of correctable error. An uncorrectable error may be a data link protocol error, a poisoned transaction layer packet (TLP) error associated with data corruption, a flow control protocol error, an overflow error, an unexpected completion error, and/or any other type of uncorrectable error.

If the error is not correctable (step 460—No), then the Rx device may send a message, at step 465, to the Tx device requesting the Tx device to resend the data. The message may include information regarding the buffer (e.g., an identifier for a particular buffer). The Tx device may receive the message and may resend the data within another buffer.

If the error is correctable (step 460—Yes), then the Rx device may determine, at step 470, whether the error has exceeded a particular threshold. For example, the threshold may be an amount of allowable error associated with a particular bus lane. The threshold may be associated with a quantity of error that will permit transmitted data to be usable by the Tx device and/or the Rx device. If the error exceeds the threshold, then the transmitted data is not usable by the Tx device and/or the Rx device.

If the threshold is not reached (step 470—No), then the Rx device, at step 475, may correct the error. The Rx device may, for example, correct the error by using one or more different types of error correcting codes, such as a Reed-Solomon code, hamming code, turbo code, Walsh-Hadamard code, and/or any other type of code that can be used to correct the error. Hamming codes are a family of linear error-correcting codes. Hamming codes can detect up to two errors and can correct up to one bit errors. The Walsh-Hadamard code is an error-correcting code that is used for error detection and correction when transmitting messages over noisy and/or unreliable channels. Reed-Solomon codes are non-binary cyclic error correcting codes that use codes that can detect and correct random symbol errors. The Reed-Solomon code adds "t" check symbols to the data so that the code can detect any combination of up to "t" erroneous symbols, or correct up to "t/2" symbols. The Reed-Solomon code may also operate as an erasure code by correcting up to "t" known errors or it can detect and correct different combinations of errors and erasures. Additionally, Reed-Solomon codes may be used as multiple burst bit-error correcting codes as a sequence of b+1 consecutive bit errors can affect, at most, two symbols of size "b." Turbo codes are error correcting codes that are associated with forward error correction codes. Turbo codes are used in mobile communications as well other communication applications that require reliable information transfer over bandwidth or latency constrained communication links in the presence of data corrupting noise.

If the threshold is reached (step 470—Yes), then the Rx device, at step 480, may create a trap. The trap may include: (i) a bus lane number associated with the transmitted data; (ii) the data, and the associated ECC and control code, stored within the Rx data array; (iii) an error type that has been identified by the Rx ECC; and (iv) the bit error counts, for all bus lanes, and the data total counts for all the bus lanes.

At step 490, the trap may be sent to an Rx processor and/or a Tx processor. For example, the trap may be sent to the Rx processor via a serial bus within the Rx device. When sending the trap to the Tx processor, the trap may also be sent via the bus lane, of the connecting device, as part of a buffer credit that includes the bus lane and the buffer credit number. The Tx device may receive the trap and may send the trap to the Tx processor. In embodiments, a request to resend the transmitted data may be sent along with the trap, within the buffer credit, to the Tx device.

Figure 5:
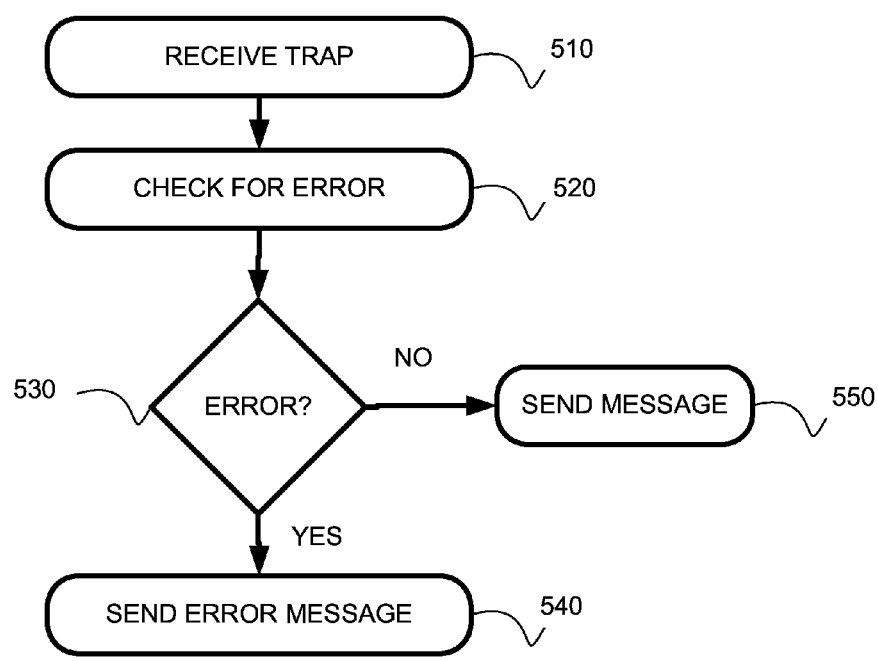

FIG. 5 depicts one example of a flow for analyzing a trap in accordance with aspects of the invention. The steps of FIG. 5 are described with regards to any type of wireless and/or wired communications between devices. In embodiments, the steps described by FIG. 5 may be performed by a Tx processor; however, the present invention contemplates one or more steps being performed by one or more other devices, such as a Tx ECC.

At step 510, a Tx device and more particularly the Tx processor receives a trap. In embodiments, the trap may be received by a Tx ECC which may then forward the trap to the Tx processor.

At step 520, the Tx processor may use the trap to check for an error associated with the Tx device. In embodiments, the Tx processor may use logic (e.g., FEC) to determine whether the error is associated with the Tx device. For example, in embodiments, the Tx processor may use statistical information from the Tx statistical component to determine whether there is an error. If there is an error (step 530—Yes), then, at step 540, a message may be sent to a system management application that an error exists and that the error is associated with the Tx device. A user of the system management application may view the message via a GUI associated with the system management application. The user may decide, based on the message, to remove the Tx device based on the quantity of error and/or the type of error. If there is no error (step 530—No), then, at step 550, a message may be sent to the system management application that there is no error.

Figure 6:
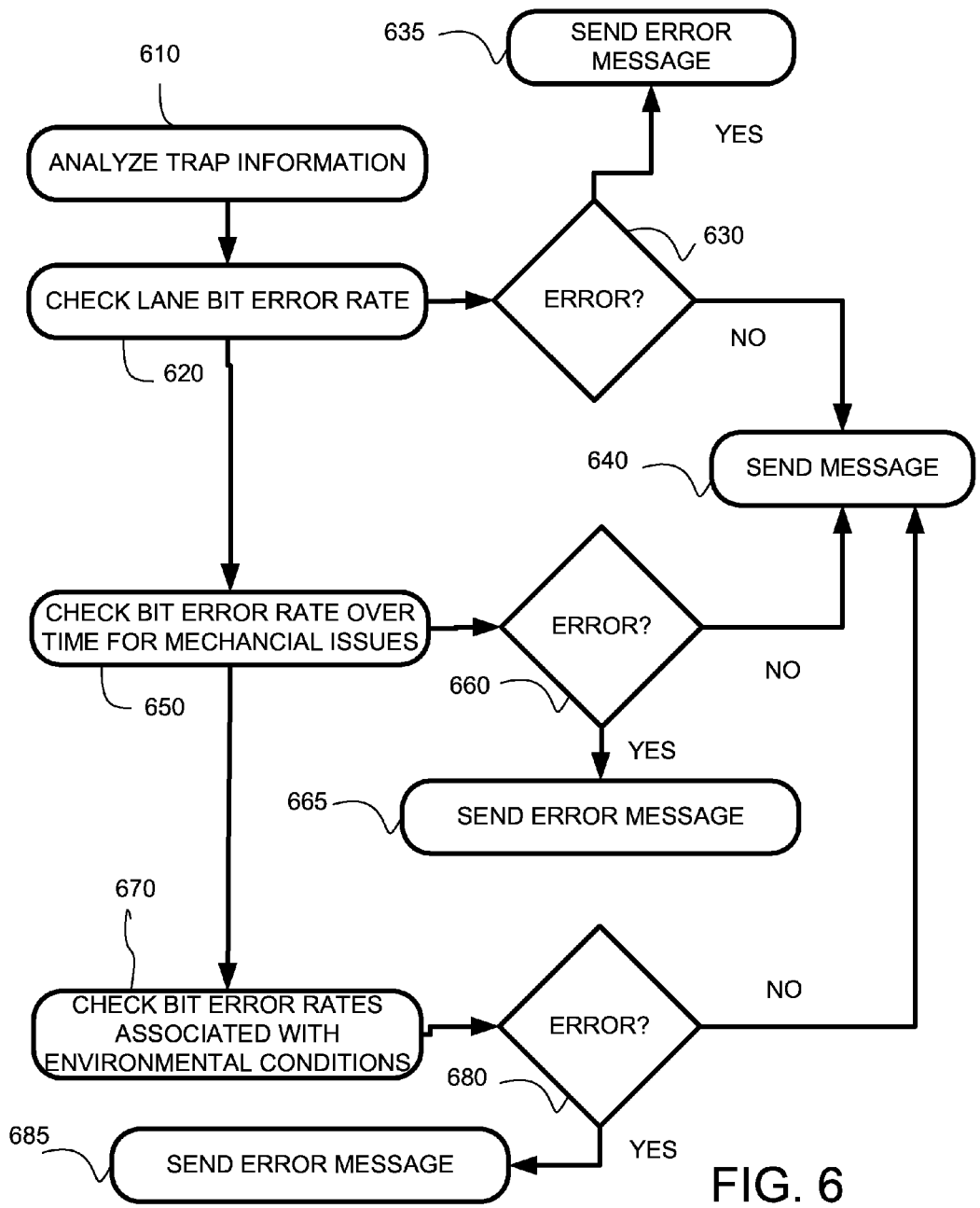

FIG. 6 depicts one example of a flow for analyzing a trap in accordance with aspects of the invention. In embodiments, the processes described in FIG. 6 may be performed by an Rx processor; although, one or more steps in the processes may be performed by one or more other devices, such as an Rx ECC and/or a Rx statistical component.

At step 610, an Rx processor may receive a trap from the Rx ECC. The trap may include: (i) the bus lane number associated with the transmitted data; (ii) the transmitted data that includes the ECC and control code; (iii) an error type; and (iv) the bit error counts for all bus lanes and total data counts for all the bus lanes.

At step 620, the Rx device processor may check for bit error rates associated with the transmitted information. The Rx device processor may, for example, statistically analyze the error rate of the particular bus lane associated with the transmitted data to determine whether the particular bus lane has an error rate that is within a statistical threshold of error rates of other bus lanes. The statistical analysis may include using different statistical methods such as analysis of standard deviation analysis, tree-analysis, binomial analysis, regression analysis, and/or any other type of statistical analysis. The Rx processor may use the statistical analysis to determine that an error beyond a threshold (e.g., greater than a half standard deviation, one standard deviation, two standard deviations, etc.) is associated with a mechanical failure. The mechanical failure may, for example, be a broken part of the Rx device, such as a broken pin, or an incorrectly connected component.

If there is an error (step 630—Yes), then, at step 635, an error message may be sent to a user. The error message may be sent to a system management application being used by a user on a computing device. The user may view the error message on a GUI, associated with the system management application, displayed by the computing device. If there is no error (step 630—No), then a message, at step 640, may be sent that indicates that there is no error. The message may be sent to the system management application being used by a user on a computing device to receive notifications of errors occurring within different devices, such as the Rx device.

At step 650, the Rx processor may check for bit error rates over time for mechanical failures. The Rx device processor may, for example, analyze several analysis points over time. A detection of similar bit error rates for all lanes during a particular period of time (e.g., over five minutes, one hour, etc.) may be determined by the Rx processor to be an error associated with a mechanical issue. For example, there may be a natural event (e.g., an earthquake) or a human-initiated event that physically disconnects the connection between the Tx device and/or the Rx device. Additionally, or alternatively, the Rx processor may determine that a detection of increasing bit error rates is a result of a degrading hardware subsystem. Additionally, or alternatively, the bit error rates may be associated with power fluctuations which are associated with a power supply device to the Rx device. In embodiments, the Rx processor may be associated with power monitoring hardware that analyzes the power input into the Rx device. The Rx processor may compare the power levels associated with the error to stored information regarding power levels associated with a threshold level of error.

The Rx processor may compare the bit error rate over a predetermined time period to stored bit error rate thresholds for the same period of time. For example, the Rx processor may store information that the bit error rate over a 12 hour period of time should result in a total of three (3) errors. The Rx processor may compare this to an actual bit error rate of the transmitted error rate which results in four (4) errors; and thus, exceeds the threshold.

In embodiments, the Rx processor may determine the bit error threshold based on the maximum capacity of the bus lane and the amount of gross bit-rate associated with the transmitted data. For example, the Rx processor may use the Shannon-Hartley theorem which stipulates the maximum rate at which information can be transmitted over a communications channel of a specified bandwidth in the presence of noise. Based on the Shannon-Hartley theorem, the Rx processor may, for example, determine that when the gross bit-rate of the transmitted data is trending away from the maximum capacity, then the bit error threshold should be decreased since the probability of an error also decreases.

If there is an error (step 660—Yes), then an error message may be sent at step 665. The error message may be sent to a GUI associated with system management application which displays the message. If there is no error (step 660—No), then a message, at step 640, may be sent to a user indicating that there is no error.

At step 670, the Rx processor may check for errors over a predetermined period of time associated with the environmental condition in which the Rx device is operating within. In this implementation, the Rx device processor may, for example, analyze several analysis points over time. A detection of similar bit error rates for all lanes during a particular predetermined period of time (e.g., over five minutes, one hour, etc.) may be determined by the Rx processor to be an error associated with a temperature and/or humidity levels of the environment within which the Rx processor is operating. The increased temperature and/or humidity levels may be associated with a heat source, such as X-rays, Gamma Rays, or sunlight any of which may result in increased noise levels that cause an increase in the amount of error. The increased noise levels can result in bit error rate thresholds being exceeded and/or a degradation of the clock rate or a bandwidth of one or more of the bus lanes.

In embodiments, the Rx processor may compare the bit error rate with a stored threshold bit error rate that is based on a particular temperature and/or humidity level. The Rx processor may use the following example equation, or a related formula, to determine the threshold bit error rate based on temperature and humidity:

$$E_b = E_i + K_t(T_a - T_i)^2 + K_h(H_a - H_i)^2$$

In the example, equation: $E_b$ is the calculated bit error rate that is used by the Rx processor to determine the bit error rate of the transmitted data from the Tx device; $E_i$ is the ideal bit error rate based on the gross bit rate and the maximum capacity of the channel (e.g., the bus lane that transmitted the data); $K_t$ is a constant or functional value that is derived from the impedance of the transmission medium with respect to temperature changes associated with the Rx processor; $K_h$ is a constant or functional value that is derived from the impedance of the transmission medium with respect to humidity changes associated with the Rx processor; $T_a$ and $H_a$ are the actual temperature and humidity of the environment and/or medium being analyzed, respectively; $T_i$ and $H_i$ is the ideal temperature and humidity of the environment and/or medium being analyzed, respectively; and $K_t$ and/or $K_h$ are functional or constant values for given insulators and conductors in laboratory environments at a given channel capacity and bandwidth.

By using the above example formula, the Rx processor can compare the threshold bit error rate to the bit error rate received within the trap.

In embodiments, the Rx processor may adjust the calculated bit error rate for an Rx device communicating via an open air transmission medium (e.g., wireless communication). The Rx processor may determine, for example, that the position of the sun with respect to a transmission antenna (associated with the Tx device) and the receiving antenna (associated with the Rx device) may result in an increase or decrease in the calculated bit error rate. To determine the calculated bit error rate, the Rx processor may analyze the angle of incidence of each antenna with respect to the sun. The Rx processor may also analyze the additional amount of noise associated with sunspots that can affect transmission whether there is a direct angle of incidence or not. The Rx processor may use the following example equation, or a related formula, to adjust the calculated bit error rate based on noise generated by the sun or any other heat source:

$$E_a = E_b + 2K_i \cos \Theta_t + 2K_s(S/N)$$

In the example equation: $E_a$ is the adjusted bit error rate threshold based on the noise generated by the sun or any other source; $E_b$ is the calculated bit error rate based on humidity and temperature levels (as described above); $K_i$ is a constant or functional coefficient of the effect of the sun on the Tx device and the Rx device; $K_s$ is a constant or functional coefficient of the effect of a sunspot or other similar activity; (S/N) is the signal to noise ratio of the open air transmission medium; $\Theta_t$ is an angle of incidence with the sun or another heat source. In embodiments, the value of "2," may be removed for a fully shielded Tx device, and for a partially shielded Tx device, the $\Theta_t$ and the $K_i$ may be increased or decreased in their respective values. In embodiments, the $K_t$, $K_h$, $K_i$, and $K_s$ values may be derived from a value that is optimal by experimentation or from laboratory experimentation associated with the environment and/or mediums associated with the transmitted data. By using the above example equation, the Rx processor may compare the threshold bit error rate to the bit error rate received within the trap to determine whether the bit error rate is less than the threshold.

If there is an error that exceeds the threshold (step 680—Yes), then an error message, at step 685 may be sent to a user. The system management application may also inform the user of options on how to resolve the problem. The options may include adjusting the bit error rate thresholds, a degradation of the clock rate or the bandwidth of the bus lanes so as to compensate for any temperature and/or humidity changes. If the error does not exceed the threshold (step 680—No), then a message, at step 640, may be sent that indicates that there is no error.

In embodiments, a service provider, such as a Solution Integrator, could offer to perform the processes described herein. In this case, the service provider can create, maintain, deploy, support, etc., the computer infrastructure that performs the process steps of the invention for one or more customers. These customers may be, for example, any business that uses technology. In return, the service provider can receive payment from the customer(s) under a subscription and/or fee agreement and/or the service provider can receive payment from the sale of advertising content to one or more third parties.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
  receiving transmitted data within a buffer, wherein the transmitted data includes an identifier for a transmitting device;
  analyzing the transmitted data, which includes using an error correcting process to detect errors;
  determining that the transmitted data has an error that requires additional analysis; and determining that the error is associated with a receiving device, the transmitting device, or a connecting device that connects the receiving device and the transmitting device, wherein the determining that the error is associated with the receiving device, the transmitting device, or the connecting device includes:

sending the error to a transmitter processor and a receiver processor for further analysis as to whether the receiving device, the transmitting device, or the connecting device is a cause of the error; and analyzing a temperature and humidity level by a processor associated with the receiving device.

2. The method of claim 1, further comprising generating a display of an analysis that indicates whether the transmitting device, the receiving device, or the connecting device is causing the error, and displaying the analysis on a graphical user interface (GUI).

3. The method of claim 1, wherein the receiving the transmitted data includes receiving error correcting code and control code.

4. The method of claim 3, wherein the error correcting code is associated with at least one of a forward error correcting (FEC) code, a Reed-Solomon code, and a turbo code.

5. The method of claim 3, wherein the control code includes code that identifies a bus lane of the connecting device which is associated with the transmitted data.

6. The method of claim 1, wherein the determining that the transmitted data has the error includes using a checksum to analyze the transmitted data.

7. The method of claim 1, wherein the determining that the transmitted data has the error includes analyzing a location and a quantity of error bits within the transmitted data.

8. The method of claim 1, further comprising:
receiving additional transmitted data;
determining that the additional transmitted data includes a different error; and
sending a trap, that includes information about the different error, to a processor, wherein the processor performs additional analysis to determine that the different error is associated with the receiving device, the transmitting device, or the connecting device.

9. A method comprising:
receiving transmitted data within a buffer, wherein the transmitted data includes an identifier for a transmitting device;
analyzing the transmitted data, which includes using an error correcting process to detect errors;
determining that the transmitted data has an error that requires additional analysis;
determining that the error is associated with a receiving device, the transmitting device, or a connecting device that connects the receiving device and the transmitting device;
receiving additional transmitted data;
determining that the additional transmitted data includes a different error; and
sending a trap, that includes information about the different error, to a processor, wherein the processor performs additional analysis to determine that the different error is associated with the receiving device, the transmitting device, or the connecting device,
wherein the additional analysis further compromises:
analyzing a bit error rate of a bus lane associated with the transmitted data and analyzing the bit error rate associated with other bus lanes; and analyzing one or more of a standard deviation, tree-analysis, binomial analysis, and regression analysis of the error and the different error.

10. The method of claim 9, wherein the transmitted data includes identifier information that identifies the transmitting device and a bus lane identifier that identifies the bus lane in the connecting device used to transmit the additional transmitted data.

11. The method of claim 1, further comprising:
receiving additional transmitted data within a second buffer;
determining that the additional transmitted data does not include any errors; and
sending a buffer credit to the transmitting device, that indicates the additional transmitted data was received and includes a request for additional data.

12. The method of claim 1, further comprising:
receiving additional transmitted data;
determining that the additional transmitted data includes a different error; and
sending a request to resend the additional transmitted data.

13. The method of claim 1, wherein steps of claim 1 are provided by a service provider on a subscription, advertising, and/or fee basis.

14. The method of claim 1, further comprising providing a computer infrastructure operable to perform the steps of claim 1 and the connecting device is a large scale copper serial attached SCSI (SAS) fabric environment.

15. A system comprising:
a CPU, a computer readable memory and a computer readable storage media;
program instructions to analyze transmitted data received from a device;
program instructions to determine when an error exists in the transmitted data; and
program instructions to analyze the error to determine which device caused the error, or requesting retransmission of the transmitted data when the error is found,
wherein the device that caused the error includes one of a receiving device, a transmitting device, and a connecting device that connects the receiving device and the transmitting device,
wherein the program instructions to analyze the error to determine that the error is caused by one of the receiving device, the transmitting device, or the connecting device includes:
program instructions to send the error to a transmitter processor and a receiver processor for further analysis as to whether the receiving device, the transmitting device, or the connecting device is a cause of the error; and
program instructions to analyze a temperature and humidity level by a processor associated with the receiving device, and
wherein the program instructions are stored on the computer readable storage media for execution by the CPU via the computer readable memory.

16. The system of claim 15, wherein the error is associated with temperature levels that result in a quantity of errors that exceed a threshold over a time period.

17. The system of claim 15, wherein the error is associated with a connecting device that allows for a transmitting device to send the transmitted data.

18. The system of claim 17, wherein the error is associated with a mechanical failure of the connecting device based on determining that the error is greater than a one of a half standard deviation, one standard deviation, or two standard deviations or based on determining that a bit error rate is above a threshold for all lanes associated with the connecting device during a particular period of time.

19. A computer program product comprising a non-transitory computer readable storage medium having readable program code embodied in the non-transitory computer readable storage medium, the computer program product includes at least one component operable to:
- receive transmitted data within a buffer from a transmitting device, wherein the transmitted data includes an identifier for a transmitting device, control code that identifies a bus lane of a connecting device being used to send the transmitted data, and a quantity of bits;
- analyze the transmitted data for errors to determine whether the quantity of bits in the transmitted data is the same as the quantity of bits in the transmitted data that is received;
- determine that the transmitted data has an error based on the quantity of bits in the transmitted data being different than the quantity of bits in the received transmitted data;
- determine whether the error can be corrected, based on a type of error in the transmitted data;
- correct the error based on determining that the type of error can be corrected so that the transmitted data can be used by a processor;
- send a buffer credit to the transmitting device to transmit additional data, based on the correcting of the error, wherein the buffer credit is a notification to the transmitting device that the transmitted data is received and to transmit the additional data;
- determine that the error is associated with a receiving device, the transmitting device, or the bus lane of the connecting device being used to send the transmitted data between the transmitting device and the receiving device; and
- receive the additional data from the transmitting device, wherein the additional data is transmitted through a different bus lane of the connecting device than the bus lane used to transmit the transmitted data,
- wherein the at least one component operable to determine that the error is associated with the receiving device, the transmitting device, or the connecting device includes the at least one component operable to:
  - send the error to a transmitter processor and a receiver processor for further analysis as to whether the receiving device, the transmitting device, or the connecting device is a cause of the error; and
  - analyze a temperature and humidity level by a processor associated with the receiving device.

\* \* \* \* \*